(12) United States Patent
Chen et al.

(10) Patent No.: US 12,225,660 B2
(45) Date of Patent: Feb. 11, 2025

(54) CIRCUIT BOARD ASSEMBLY FOR BLOCKING UNWANTED LIGHT, CAMERA MODULE, AND ELECTRONIC DEVICE HAVING THE SAME

(71) Applicant: TRIPLE WIN TECHNOLOGY(SHENZHEN) CO.LTD., Shenzhen (CN)

(72) Inventors: Ying-Lin Chen, New Taipei (TW); Chia-Weng Hsu, New Taipei (TW); Ping-Liang Eng, New Taipei (TW); Feng-Chang Chien, New Taipei (TW)

(73) Assignee: TRIPLE WIN TECHNOLOGY(SHENZHEN) CO.LTD., Shenzhen (CN)

( * ) Notice: Subject to any disclaimer, the term of this patent is extended or adjusted under 35 U.S.C. 154(b) by 276 days.

(21) Appl. No.: 17/883,861

(22) Filed: Aug. 9, 2022

(65) Prior Publication Data

US 2023/0413426 A1   Dec. 21, 2023

(30) Foreign Application Priority Data

Jun. 10, 2022  (CN) .......................... 202210656626.2

(51) Int. Cl.
| | |
|---|---|
| H05K 5/00 | (2006.01) |
| G02B 5/00 | (2006.01) |
| H04N 23/55 | (2023.01) |
| H05K 1/02 | (2006.01) |
| H05K 1/18 | (2006.01) |
| H05K 3/46 | (2006.01) |

(52) U.S. Cl.
CPC ........... *H05K 1/0274* (2013.01); *G02B 5/003* (2013.01); *H04N 23/55* (2023.01); *H05K 1/0277* (2013.01); *H05K 1/0298* (2013.01); *H05K 1/183* (2013.01); *H05K 3/4691* (2013.01); *H05K 2201/1009* (2013.01); *H05K 2201/10151* (2013.01)

(58) Field of Classification Search
None
See application file for complete search history.

(56) References Cited

U.S. PATENT DOCUMENTS

| | | | | |
|---|---|---|---|---|
| 2018/0293420 | A1* | 10/2018 | Kim | H05K 1/189 |
| 2019/0073505 | A1* | 3/2019 | Kwon | H05K 1/028 |
| 2020/0045826 | A1* | 2/2020 | Wang | H05K 1/147 |
| 2022/0053110 | A1* | 2/2022 | Park | H04N 23/57 |

FOREIGN PATENT DOCUMENTS

| | | |
|---|---|---|
| CN | 206226570 U | 6/2017 |
| TW | 202018481 A | 5/2020 |

* cited by examiner

*Primary Examiner* — Anthony M Haughton
*Assistant Examiner* — Rashen E Morrison
(74) *Attorney, Agent, or Firm* — ScienBiziP, P.C.

(57) ABSTRACT

A circuit board assembly in a camera module for blocking unwanted light when images are captured includes a circuit board, a sensor, and an optical blocking body connecting the circuit board and the sensor. The circuit board includes a base board and a photomask. The photomask is arranged on a surface of the base board, the base board includes conductive circuit layers and dielectric layers, the conductive circuit layers and the dielectric layers are alternately arranged, the sensor being electronically connected to the conductive layers. The optical blocking body, the photomask, and the dielectric layers block ambient light entering the camera module other than through the lens assembly of the camera module.

17 Claims, 7 Drawing Sheets

CIRCUIT BOARD ASSEMBLY FOR BLOCKING UNWANTED LIGHT, CAMERA MODULE, AND ELECTRONIC DEVICE HAVING THE SAME

FIELD

The subject matter herein generally relates to imaging, and more particularly, to a circuit board for blocking light, and a camera module having the circuit board, and an electronic device having the camera module.

BACKGROUND

A camera module includes a lens assembly, a lens base, a photosensitive chip, and a circuit board. The lens assembly is arranged on a side of the lens base. Another side of the lens base is arranged on the circuit board. The photosensitive chip is arranged between the circuit board and the lens base, and corresponds to the lens assembly.

In order to reduce a height of the camera module, the circuit board defines an opening for receiving at least a portion of the photosensitive chip. The photosensitive chip and the circuit board are electrically connected to each other by gold wires.

However, the opening in the circuit board may allow ambient light to travel into the camera module. Such light cannot be focused by the lens assembly but will be imaged in the photosensitive chip, thereby reducing the imaging quality.

BRIEF DESCRIPTION OF THE DRAWINGS

Many aspects of the disclosure can be better understood with reference to the following drawings. The components are not necessarily drawn to scale, the emphasis instead being placed upon clearly illustrating the principles of the disclosure.

DETAILED DESCRIPTION

Figure 1:
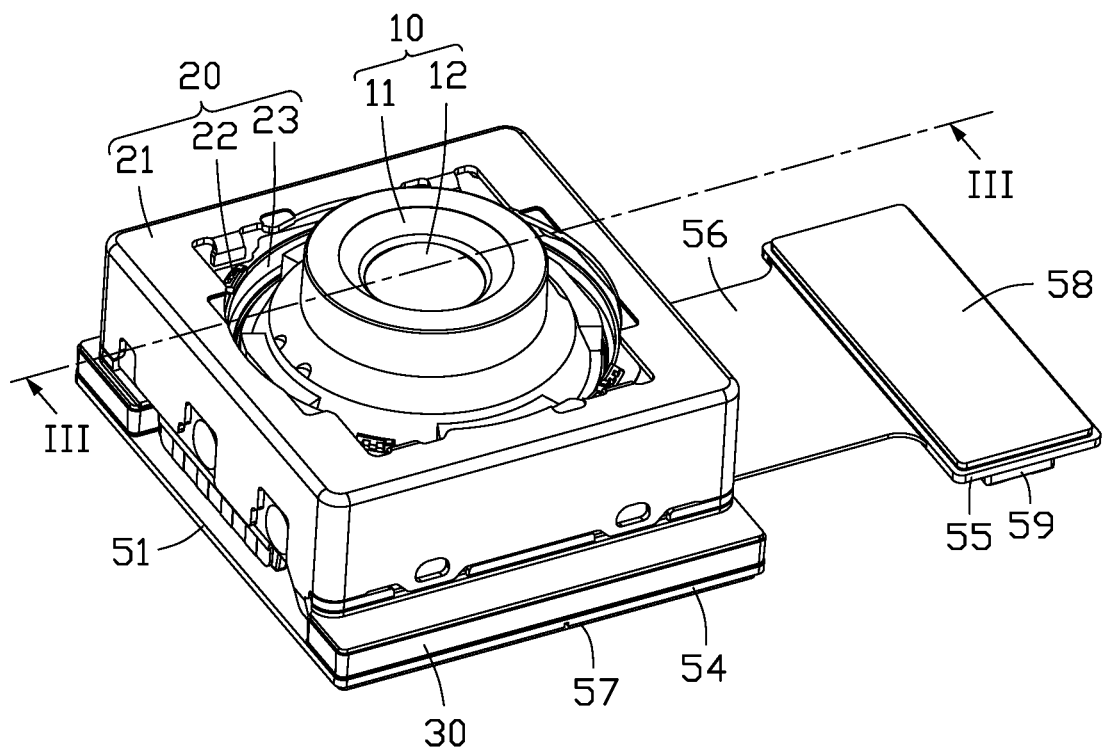
FIG. 1 is a diagrammatic view of a camera module according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Referring to FIG. 1, an embodiment of a camera module 200 is provided. The camera module 200 can be used in any electronic device 300 (refer to FIG. 7) with an image capturing function.

Figure 2:
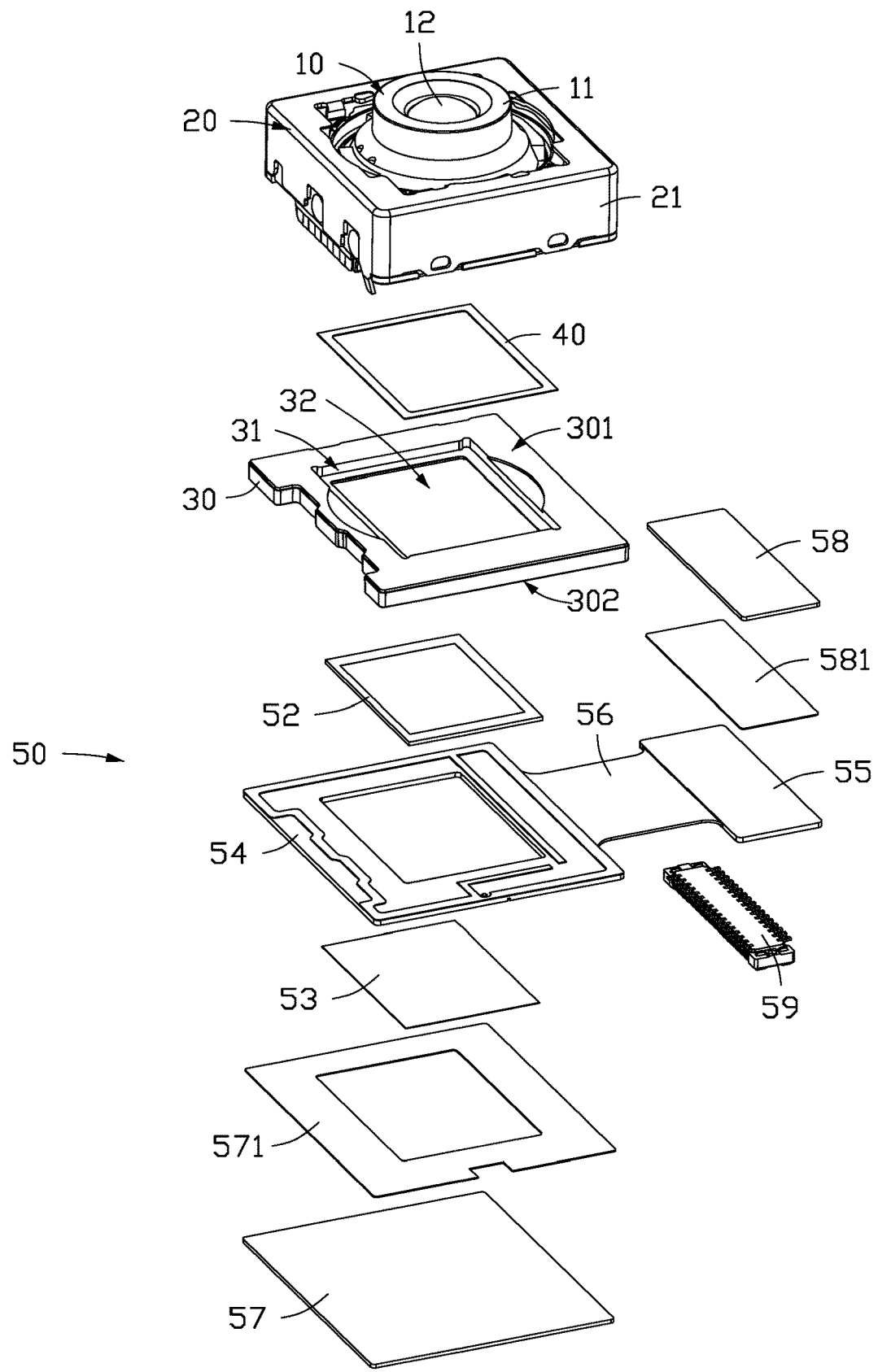
FIG. 2 is an exploded view of the camera module of FIG. 1.
Figure 3:
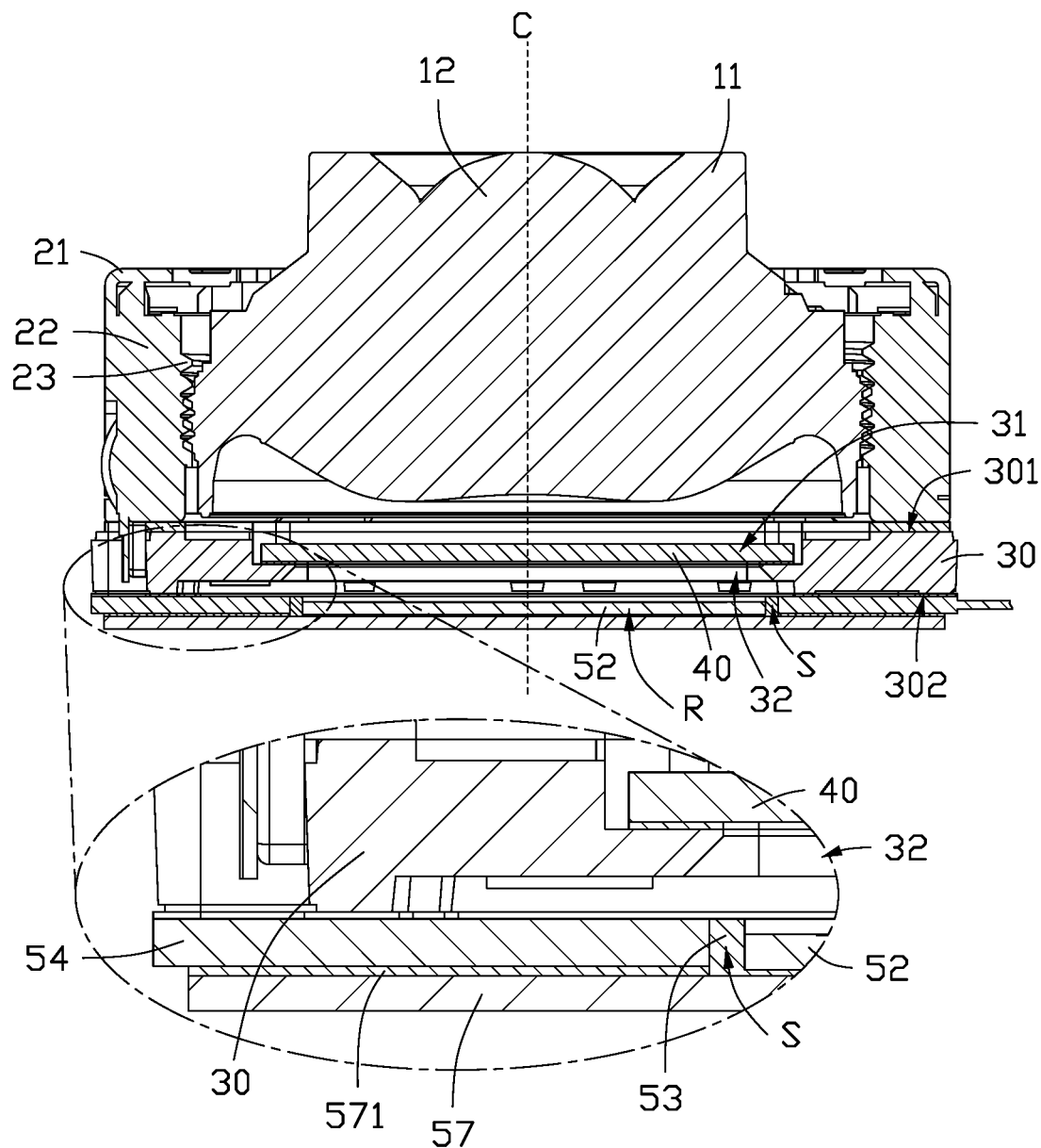
FIG. 3 is a cross sectional view along line of FIG. 1.

Referring to FIGS. 2 and 3, the camera module 200 includes a lens assembly 10, a voice coil motor 20, a bracket 30, a filter 40, and a circuit board assembly 50. The lens assembly 10 is movably disposed within the voice coil motor 20. The bracket 30 is arranged between the voice coil motor 20 and the circuit board assembly 50.

Referring to FIGS. 2 and 3, the lens assembly 10 defines an optical axis C, and includes a lens barrel 11 and a plurality of optical lenses 12. The optical lenses 12 are disposed within the lens barrel 11, and are spaced from each other.

Referring to FIG. 3, the voice coil motor 20 includes a housing 21, an actuator 22, and a mounting ring 23. The mounting ring 23 is disposed within the housing 21. The actuator 22 is connected between the mounting ring 23 and the housing 21, so that the actuator 22 can drive the mounting ring 23 to move back and forth along the optical axis C. The lens assembly 10 is disposed within the mounting ring 23, so that the actuator 22 can drive the lens assembly 10 to move back and forth along the optical axis C to adjust a focal length of the lens assembly 10.

Referring to FIGS. 2 and 3, the bracket 30 includes a top surface 301 and a bottom surface 302. The bottom surface 302 faces the top surface 301. The bracket defines a receiving groove 31 and an aperture 32. The top surface 301 is recessed inward to form the receiving groove 31. The aperture 32 penetrates the top surface 301 and the bottom surface 302. Along the optical axis C, an orthographic projection of the aperture 32 is within the receiving groove 31. The filter 40 is disposed within the receiving groove 31. A side of the filter 40 faces the lens assembly 10, and other side of the filter 40 faces the circuit board assembly 50. The filter 40 is used to block the transmission of infrared light. Specifically, the filter 40 is an infrared cut-off filter. In other embodiments of the application, if the surface of the optical lens 12 is coated with a filter film, the bracket 30 and the filter 40 may be omitted.

Referring to FIGS. 2 and 3, the circuit board assembly 50 is connected to the bottom surface 302. The circuit board assembly 50 includes a circuit board 51 and a sensor 52. The circuit board 51 is electrically connected to the sensor 52 and the actuator 22. The sensor 52, the filter 40, and the plurality of optical lenses 12 are aligned along the optical axis C. The light passing through the lens assembly 10 forms an optical image on the sensor 52. The sensor 52 converts the optical image to electrical signal, and the circuit board 51 then transmits the electrical signal to a processor (not shown). The processor analyzes the electrical signal and generates a signal. The circuit board 51 transmits the signal to the actuator 22. The actuator 22 drives the lens assembly 10 to move back and forth based on the signal until the lens assembly 10 reaches an optimum position and forms a clear optical image on the sensor 52.

Figure 4:
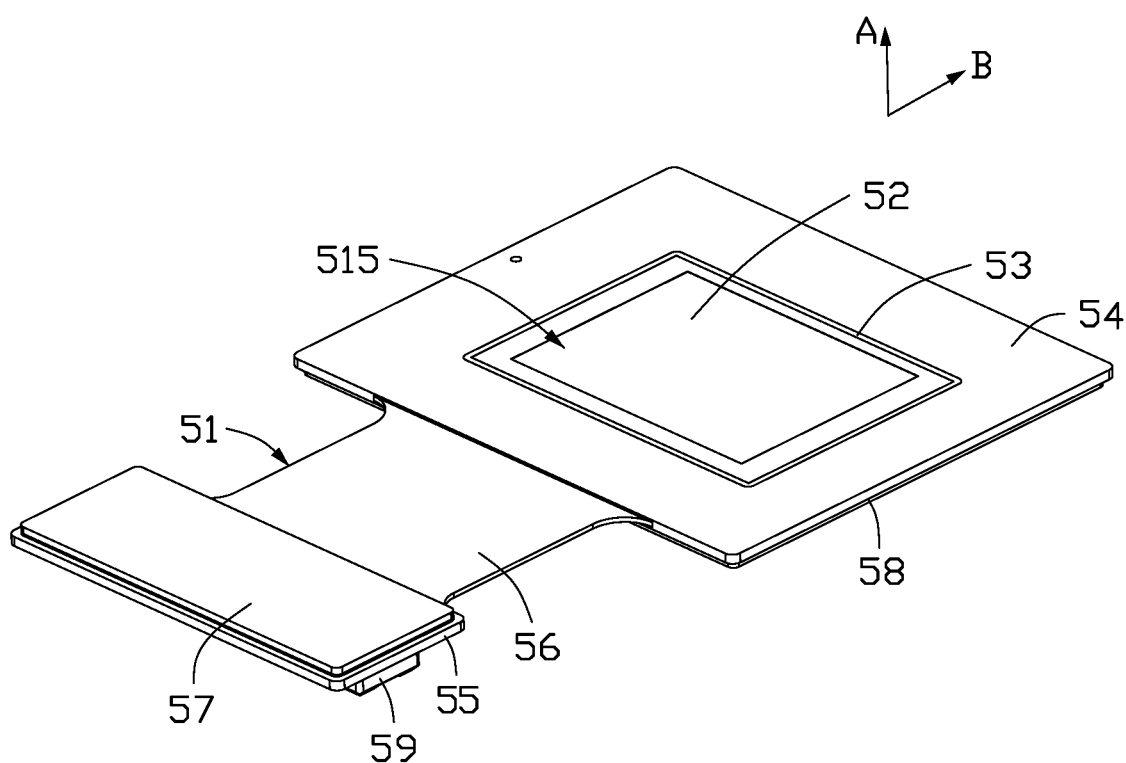
FIG. 4 is a diagrammatic view of a circuit board assembly of the camera module of FIG. 1.
Figure 5:
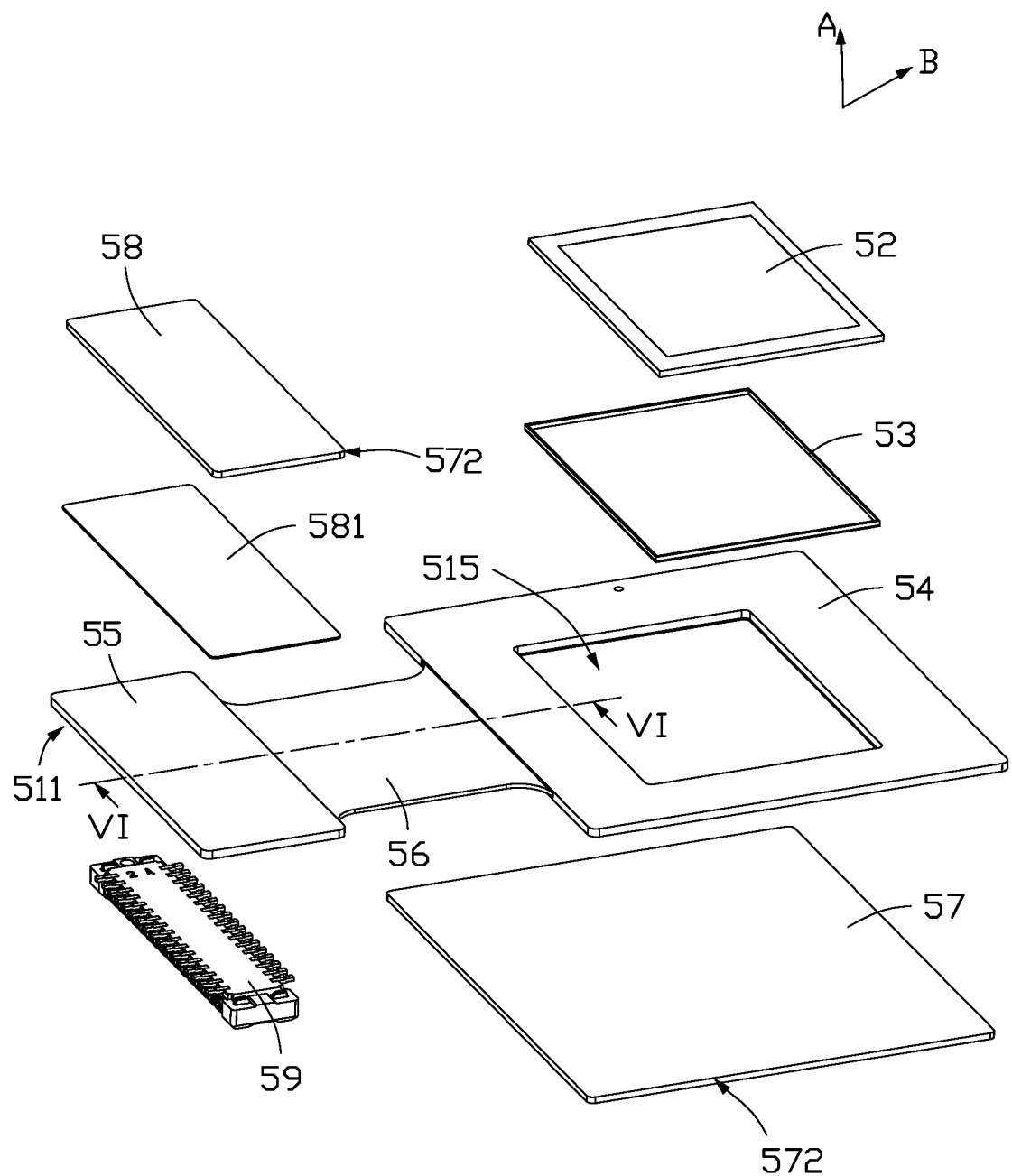
FIG. 5 is an exploded view of the circuit board assembly of FIG. 4.
Figure 6:
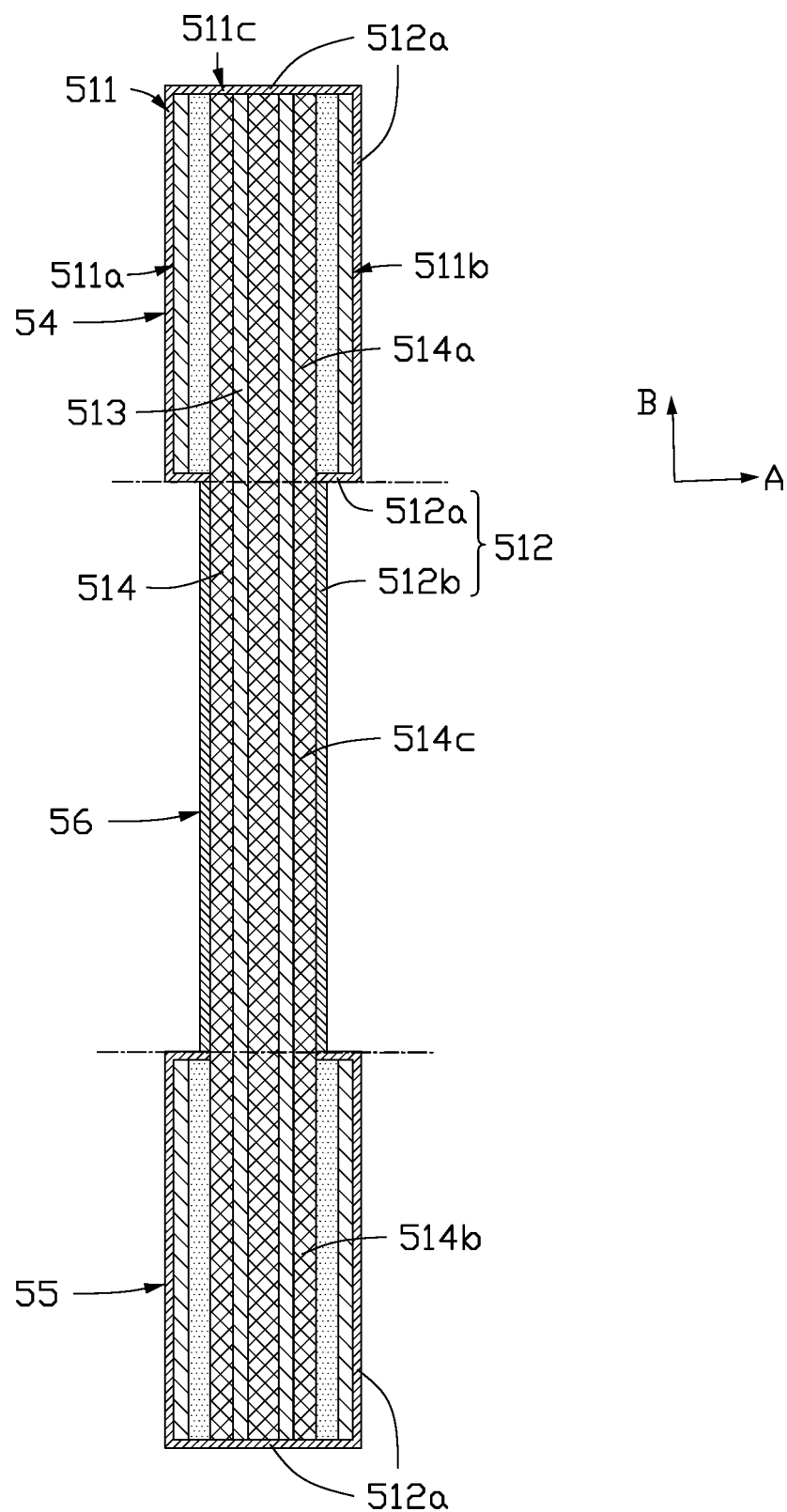
FIG. 6 is a cross sectional view along line VI-VI of FIG. 4.

Referring to FIGS. 4, 5 and 6, the circuit board 51 is substantially strip-shaped. A first direction A is defined as a thickness direction of the circuit board 51, and a second direction B is defined as a widthwise direction of the circuit board 51. The circuit board 51 includes a base board 511 and a photomask 512. The photomask 512 is disposed on an outer surface of the base board 511. The base board 511 includes a plurality of conductive circuit layers 513 and a plurality of dielectric layers 514. The circuit layers 513 and the dielectric layers 514 are alternately arranged along the first direction A. The base board 511 defines a hole 515. The hole 515 penetrates the photomask 512, the circuit layers 512, and the dielectric layers 514. The sensor 52 is disposed within the hole 515. An inner sidewall of the hole 515 and an outer periphery of the sensor 52 cooperatively define a gap S. The circuit board assembly 10 further includes an optical blocking body 53. The optical blocking body 53 is disposed within the gap S. The sensor 52 and the actuator 22 are electrically connected to the circuit layers 513. The dielectric layers 514, the optical blocking body 53, and the photomasks 512 are all black in color, and are strongly block of the light from the ambient environment, which prevents the light from passing the dielectric layers 514 and reaching the sensor 52. Thus, glare and over exposure are avoided, which improves the image quality. Specifically, the sensor 52 and the circuit layers 513 are connected by gold wires (not shown).

Referring to FIGS. 4, 5 and 6, in this embodiment, the base board 511 is substantially rectangular. The base board 511 includes a first surface 511a, a second surface 511b, and a plurality of side surfaces 511c. The first surface 511a faces the second surface 511b. The side surfaces 511c connect the first surface 511a and the second surface 511b. The photomask 512 is disposed on the first surface 511a, the second surface 511b, and the side surfaces 511c. The photomask 512 covers all outer surfaces of the base board 511, thereby further blocking the light from the ambient environment from reaching the sensor 52.

Referring to FIGS. 4, 5 and 6, in this embodiment, along the widthwise second direction B, the base board 511 is divided into a first rigid region 54, a second rigid region 55, and a flexible region 56. The flexible region 56 is disposed between the first rigid region 54 and the second rigid region 55. Along the second direction B, the dielectric layer 514 is divided into a first portion 514a, a second portion 514b, and a third portion 514c. The first portion 514a is disposed in the first rigid region 54. The second portion 514b is disposed in the second rigid region 55. The third portion 514c is disposed in the flexible region 56. The first portion 514 and the second portion 514b are more rigid than the third portion 514c. Specifically, each of the first portion 514a and the second portion 514b is of black glass or black ceramic. The third portion 514c is made of black polyimide material.

Referring to FIGS. 4, 5 and 6, along the second direction B, the photomask 512 is divided into two black solder masks 512a and a black cover film 512b. One of the black solder masks 512a covers the first rigid region 54. The other black solder mask 512a covers the second rigid region 55. The black cover film 512b covers the flexible region 56. Specifically, each of the solder masks 512a and the black cover film 512b includes resin and black filler.

Referring to FIGS. 4, 5 and 6, in this embodiment, the circuit assembly 50 further includes a first support plate 57. The first support plate 57 is arranged on a side of the first region 54 facing away from the bracket 30. The first support plate 57 covers the hole 515 to form a receiving space R. The sensor 52 is disposed within the receiving space R. The optical blocking body 53 fills the gap between the sensor 52 and the first support plate 57. The optical blocking body 53 can further prevent ambient light from travelling to the sensor 52. The optical blocking body 53 can also conduct heat generated by the sensor 52 to the first support plate 57 and reduce the temperature of the sensor 52. Specifically, the optical blocking body 53 is made of a black heat conducting silica gel. The first support plate 57 is used for increasing a stiffness of the first rigid region 54 as well as dissipating the heat generated by the sensor 52.

Referring to FIGS. 4, 5 and 6, in this embodiment, the circuit board assembly further includes a second support plate 58 and a connector 59. The second support plate 58 is disposed on a side of the second rigid region 55 that faces the bracket 30. The connector 59 is disposed on other side of the second rigid region 55 that is opposite to the support plate 58. The second support plate 58 is used for increasing the rigidity of the second rigid region 55. The connector 59 is used for connecting the camera module 200 to electric components, such as the above-mentioned processor.

Referring to FIGS. 4, 5 and 6, in this embodiment, the camera module 200 further includes a first adhesive sheet 571 and a second adhesive sheet 581. The first support plate 57 and the second support plate 58 are steel plates. The first support plate 57 is connected to the first rigid region 54 through the first adhesive sheet 571 (referring to FIG. 2). The second support plate 58 is connected to the second rigid region 55 through the second adhesive sheet 581. The first support plate 57 and the second support plate 58 are coated with a black coating layer 572, and the black coating layer 572 can further block light from the ambient environment.

Figure 7:
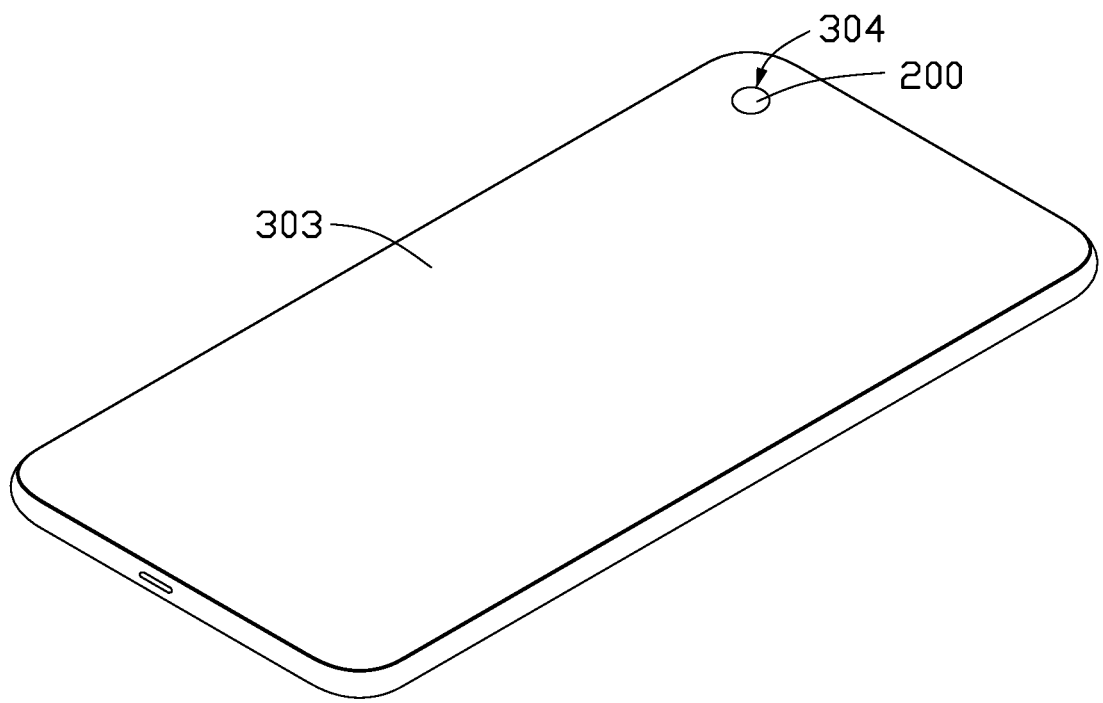
FIG. 7 is a diagrammatic view of an electronic device according to an embodiment of present disclosure.

Referring to FIG. 7, an embodiment of an electronic device 300 is provided. The electronic device 300 includes a casing 303 and the camera module 200. The casing 303 defines an opening 304, and the camera module 200 is disposed within the casing 300. A portion of the camera module 200 is exposed from the opening 304. Specifically, the electronic device 300 may be a cell phone, a laptop computer, an IPAD, a smartwatch, or any other device with imaging function.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A circuit board assembly comprising:
a circuit board defining a hole;
a sensor disposed in the hole, an inner sidewall of the hole and an outer periphery of the sensor cooperatively defining a gap; and
an optical blocking body disposed in the gap;
wherein the circuit board comprises a base board and a photomask, the photomask is arranged on the base board, the base board comprises a plurality of conductive circuit layers and a plurality of dielectric layers, the plurality of conductive circuit layers and the plurality of dielectric layers are alternately arranged, the sensor is electrically connected to the plurality of the conductive layers, the hole penetrates the photomask, the plurality of dielectric layers, and the plurality of conductive circuit layers, the optical blocking body, the photomask, and the plurality of dielectric layers are configured to block light from an ambient environment;
wherein the base board comprises a first surface, a second surface, and a plurality of side surfaces, the plurality of side surfaces connects the first surface and the second surface, the photomask is arranged on each of the first surface, the second surface, and the plurality of side surfaces.

2. The circuit board assembly of claim 1, wherein the photomask comprises a black solder mask and a black cover film, the base board defines a flexible region and a rigid region, the black solder mask is arranged on the rigid region, and the black cover film is arranged on the flexible region.

3. The circuit board assembly of claim 2, further comprising a support plate, wherein the support plate is arranged on the rigid region and covers the hole, and the optical blocking body is further disposed between the support plate and the sensor.

4. The circuit board assembly of claim 3, wherein the support plate is coated with a black coating layer.

5. The circuit board assembly of claim 3, further comprising a connector, wherein the connector is disposed on the rigid region, and the connector faces away from the support plate.

6. The circuit board assembly of claim 1, wherein a color of each of the optical blocking body, the photomask, and the plurality of dielectric layer is black.

7. A camera module comprising:
a voice coil motor;
a lens assembly disposed in the voice coil motor; and
a circuit board assembly connected to the voice coil motor;
wherein the circuit board assembly comprises a circuit board defining a hole, a sensor disposed in the hole, and an optical blocking body, an inner sidewall of the hole and an outer periphery of the sensor cooperatively define a gap, the optical blocking body is disposed within the gap; and
the circuit board comprises a base board and a photomask, the photomask is arranged on the base board, the base board comprises a plurality of conductive circuit layers and a plurality of dielectric layers, the plurality of conductive circuit layers and the plurality of dielectric layers are alternately arranged, the sensor is electrically connected to the plurality of the conductive layers, the hole penetrates the photomask, the plurality of dielectric layers, and the plurality of conductive circuit layers, the optical blocking body, the photomask, and the plurality of dielectric layers are configured to block light from an ambient environment;
wherein the camera module further comprising a bracket and a filter, wherein the bracket is arranged between the voice coil motor and the circuit board assembly, the filter is disposed within the bracket, and the filter faces the lens assembly and the sensor.

8. The camera module of claim 7, wherein the base board comprises a first surface, a second surface, and a plurality of side surfaces, the plurality of side surfaces connects the first surface and the second surface, the photomask is arranged on each of the first surface, the second surface, and the plurality of side surfaces.

9. The camera module of claim 7, wherein the photomask comprises a black solder mask and a black cover film, the base board defines a flexible region and a rigid region, the black solder mask is arranged on the rigid region, and the black cover film is arranged on the flexible region.

10. The camera module of claim 9, wherein the circuit board assembly further comprises a support plate, the support plate is arranged on the rigid region and covers the hole, the optical blocking body is further disposed between the support plate and the sensor.

11. The camera module of claim 10, wherein the support plate is coated with a black coating layer.

12. The camera module of claim 10, further comprising a connector, wherein the connector is disposed on the rigid region, the connector faces away from the support plate.

13. The camera module of claim 7, wherein a color of each of the optical blocking body, the photomask, and the plurality of dielectric layer are black.

14. An electronic device comprising:
a casing defining an opening; and
a camera module disposed within the casing; a portion of the camera is exposed from the opening;
wherein the camera module comprising:
a voice coil motor;
a lens assembly disposed in the voice coil motor; and
a circuit board assembly connected to the voice coil motor;
the circuit board assembly comprises a circuit board defining a hole, a sensor disposed in the hole, and an optical blocking body, an inner sidewall of the hole and an outer periphery of the sensor cooperatively define a gap, the optical blocking body is disposed within the gap;
the circuit board comprises a base board and a photomask, the photomask is arranged on the base board, the base board comprises a plurality of conductive circuit layers and a plurality of dielectric layers, the plurality of conductive circuit layers and the plurality of dielectric layers are alternately arranged, the sensor is electrically connected to the plurality of the conductive layers, the hole penetrates the photomask, the plurality of dielectric layers, and the plurality of conductive circuit layers, the optical blocking body, the photomask, and the plurality of dielectric layers are configured to block light from an ambient environment;
wherein the camera module further comprises a bracket and a filter, wherein the bracket is arranged between the voice coil motor and the circuit board assembly, the filter is disposed within the bracket, the filter faces the lens assembly and the sensor.

15. The electronic device of claim 14, wherein the base board comprises a first surface, a second surface, and a plurality of side surfaces, the plurality of side surfaces connects the first surface and the second surface, the photomask is arranged on each of the first surface, the second surface, and the plurality of side surfaces.

16. The electronic device of claim 14, wherein the photomask comprises a black solder mask and a black cover film, the base board defines a flexible region and a rigid region, the black solder mask is arranged on the rigid region, the black cover film is arranged on the flexible region.

17. The electronic device of claim 16, wherein the circuit board assembly further comprises a support plate, the support plate is arranged on the rigid region and covers the hole, the optical blocking body is further disposed between the support plate and the sensor.

* * * * *